United States Patent [19]
Tsuruta et al.

[11] Patent Number: 5,567,968
[45] Date of Patent: Oct. 22, 1996

[54] SEMICONDUCTOR DEVICE HAVING SOI STRUCTURE AND METHOD FOR FABRICATING THE SAME

[75] Inventors: Kazuhiro Tsuruta, Toyoake; Harutsugu Fukumoto, Anjo; Seiji Fujino, Toyota, all of Japan

[73] Assignee: Nippondenso Co., Ltd., Kariya, Japan

[21] Appl. No.: 432,643

[22] Filed: May 3, 1995

[30] Foreign Application Priority Data

May 18, 1994 [JP] Japan ..................................... 6-103985

[51] Int. Cl.⁶ .................................................. H01L 23/62
[52] U.S. Cl. ........................................... 257/356; 257/355
[58] Field of Search ...................................... 257/356, 355

[56] References Cited

U.S. PATENT DOCUMENTS 5,204,988  4/1993  Sakurai ..................................... 257/356
5,426,322  6/1995  Shiota ...................................... 257/355

FOREIGN PATENT DOCUMENTS 2-97066  4/1990  Japan .

*Primary Examiner*—Stephen Meier
*Attorney, Agent, or Firm*—Cushman, Darby & Cushman

[57] ABSTRACT

A pn diode as an electrostatic discharge protection element of a MOSFET in a semiconductor device having an SOI structure to enable large current to flow is disclosed. $N^+$ layers and $p^+$ layers are formed on a surface of an element-isolation region isolated from another element region by dielectrics, and a polycrystalline silicon layer is formed by burying under these. Accordingly, the $n^+$ layer and $p^+$ layer and the $n^+$ layer and $p^+$ layer are respectively connected electrically via the polycrystalline silicon layer, structuring pn diodes. Consequently, the respective pn diodes become vertical pn junctions and it becomes possible to allow large current flow. Additionally, a MOSFET is formed on the dielectric in another element region, and a pn diode functions as an electrostatic discharge protection element of this MOSFET.

23 Claims, 5 Drawing Sheets

5,567,968

SEMICONDUCTOR DEVICE HAVING SOI STRUCTURE AND METHOD FOR FABRICATING THE SAME

CROSS REFERENCE TO RELATED APPLICATION

This application is based upon and claims the benefit of priority of the prior Japanese Patent application No. 6-103985 filed on May 18, 1994, the contents of which are incorporated herein by reference.

BACKGROUND OF THE INVENTION

1. Field of the Invention

The present invention relates to a semiconductor device, and more particularly, to an electrostatic discharge protection element in a semiconductor device employing an SOI, i.e., silicon on insulator, structure.

2. Related Arts

MOSFET research forming a monocrystalline silicon layer on an insulator has been performed amidst advances in faster speed and greater integration of semiconductor devices. In a semiconductor device of this type, normally, to prevent MOSFETs, particularly gate-oxide films, from being destroyed by excessive current due to static electricity, surges, or the like, an electrostatic discharge protection element employing a diode is required on an input pad portion, as is indicated by Japanese Patent Application Laid-open No. 2-97066 Patent Gazette.

Here, in a protective diode of this type, a pn diode of large area is formed at a device formed on a bulk-silicon substrate by a pn junction of an $n^-$ well and $p^+$ diffusion layer or a $p^-$ well and an $n^+$ diffusion layer, and large current flow is possible.

In an element formed on a thin-film SOI substrate, however, a pn junction can be formed only at a lateral cross-section of the thin SOI layer, and so an attempt to gain a pn-junction area equal to the foregoing bulk requires an element area several tens of times larger, and the problem of impracticality exists.

SUMMARY OF THE INVENTION

In light of the foregoing problem, it is an object of the present invention to enable formation of an electrostatic discharge protection element of new structure wherein large current flow in a semiconductor device having an SOI structure is possible.

To attain the foregoing object, the present invention is a semiconductor device including a p-type semiconductor layer and an n-type semiconductor layer both disposed on a surface of an island region which is isolated from another element region by a dielectric member, a buried semiconductor layer for conduction use disposed in the island region and below the p-type semiconductor layer and the n-type semiconductor layer, wherein the p-type semiconductor layer and the n-type semiconductor layer are electrically connected via the semiconductor layer for conduction use, thereby structuring a PN diode.

Herein, when a MOSFET is formed on the dielectric member in the other element region and the PN diode is electrically connected to the MOSFET, the PN diode can function as an electrostatic discharge protection element.

Furthermore, in the above arrangement, it is preferable for the PN diode to have a dielectric member for isolating the p-type semiconductor layer and n-type semiconductor layer laterally.

On the other hand, a method for fabricating a semiconductor device according to the present invention comprises: a step to form a first dielectric on a semiconductor substrate having unevenness; a step to form first and second openings on the first dielectric; a step to form a semiconductor layer for conduction use on a region including the first and second openings, together with forming a second dielectric on the semiconductor layer for conduction use to isolate the semiconductor layer and another element region; a step to level a surface of the second dielectric with a semiconductor layer for leveling use; a step to polish a surface of the semiconductor substrate having unevenness and form first and second semiconductor regions at locations corresponding to the first and second openings with the unevenness thereof and the first dielectric; and a step to form a p-type semiconductor layer and an n-type semiconductor layer in the first and second semiconductor regions.

Herein, the step to form a surface of a semiconductor substrate also forms the other element region to be isolated by unevenness of the semiconductor substrate and the first dielectric; and a manufacturing method according to the present invention preferably further comprises a step to form a MOSFET in the other element region formed.

According to the present invention, in the island region isolated from the other element region by the dielectric material, the p-type semiconductor layer and n-type semiconductor layer are electrically connected via the buried semiconductor layer for conduction use so as to structure PN diode. Therefore, a pn junction comes to be formed in a vertical cross-section, whereby demonstrating the effect of enabling large current to flow in a small element area and enabling high resistance to electrostatic destruction are obtained.

Furthermore, by forming the pn diode on a semiconductor substrate of SOI structure and forming a MOSFET in another element region, it becomes possible to supply large current by the pn diode of vertical pn junction, thereby demonstrating the effect of being able to adequately prevent destruction of the MOSFET due to excessive current from static electronic, surges, or the like.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment according to the present invention will be described hereinafter with reference to the drawings.

Figure 1:
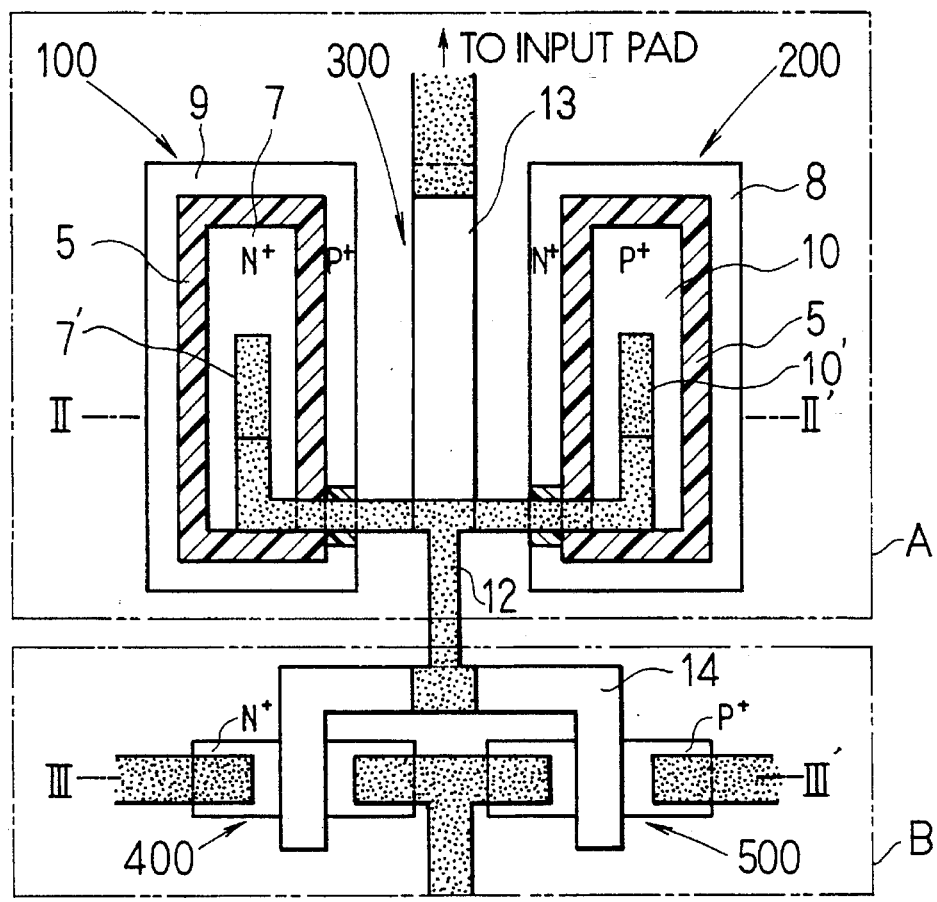
FIG. 1 is a plan view of a semiconductor device according to a first embodiment of the present invention.
Figure 4:
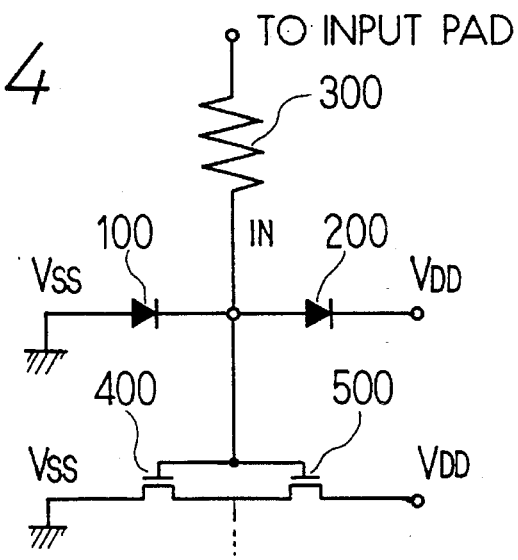
FIG. 4 is an electrical circuit diagram of the device shown in FIG. 1.

FIG. 1 indicates a plan view of a semiconductor device according to a first embodiment of the present invention, and FIG. 4 indicates an electrical circuit diagram thereof. In FIG. 1, first and second diodes 100 and 200 are formed in a first region A of a semiconductor substrate so as to sandwich a protective resistor 300, and an n-channel MOSFET 400 and p-channel MOSFET 500 are formed a second region B. These are electrically connected by aluminum leads, and structured into the electrical circuit indicated in FIG. 4. The first and second diodes 100 and 200 function as electrostatic discharge protection elements against static electronic, surges, and the like with respect to the gate-oxide films of the n-channel MOSFET 400 and p-channel MOSFET 500.

Figure 2:
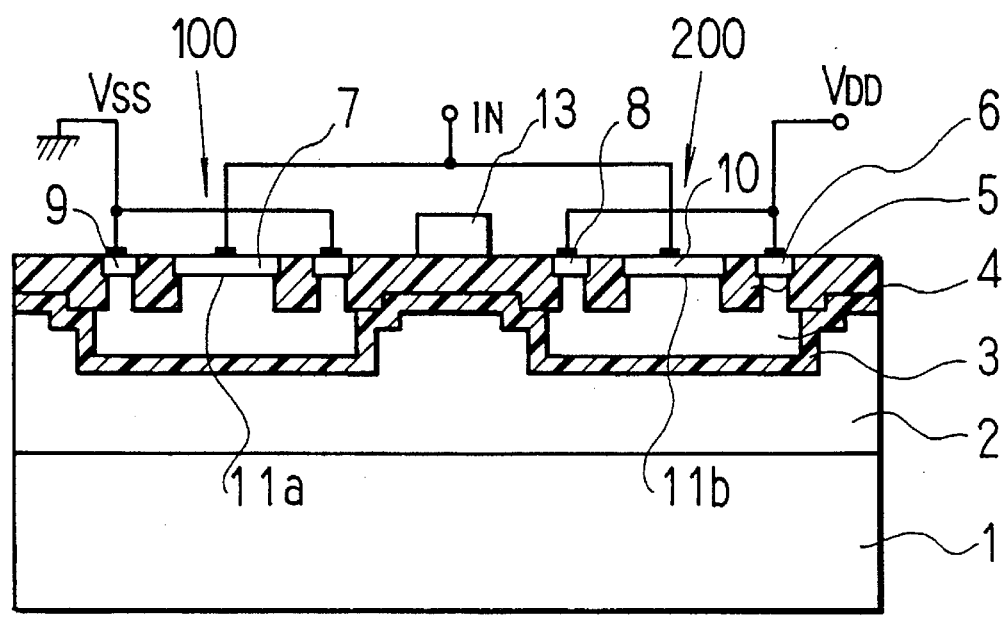
FIG. 2 is a sectional view taken along line II–II' of FIG. 1.
Figure 3:
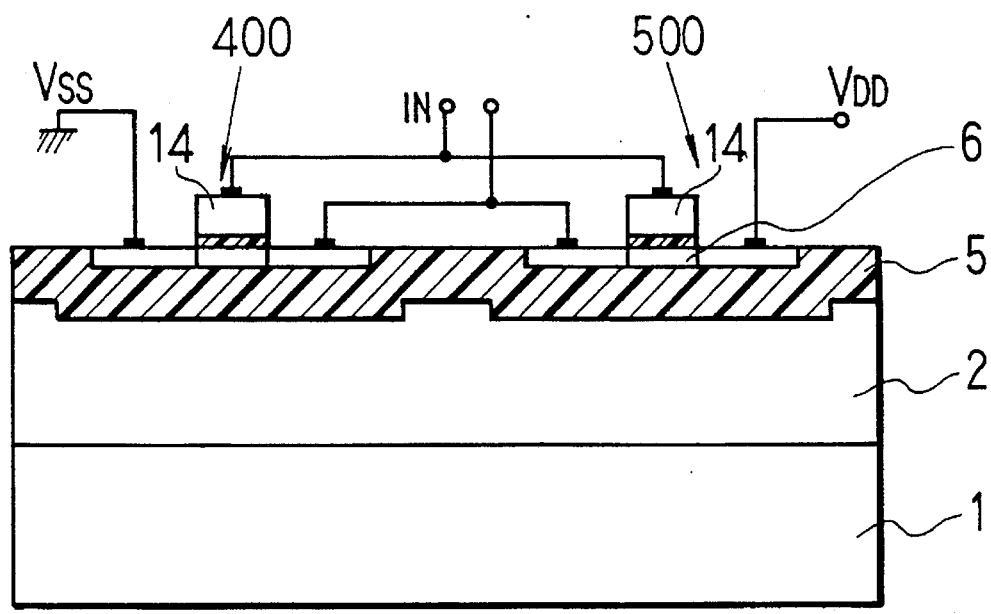
FIG. 3 is a sectional view taken along line III–III' of FIG. 1.

FIG. 2 and FIG. 3 indicate sectional views along line II–II' and along line III–III' of FIG. 1, respectively. In these drawings, the structural portion of the aluminum leads is omitted and only the connections thereof are indicated.

FIG. 2 indicates a sectional view of the first and second diodes 100 and 200 and the protective resistor 300; 1 is a monocrystalline silicon substrate, a polycrystalline silicon layer 2 is formed on this substrate 1, and moreover a polycrystalline silicon layer 4 is formed interposing a silicon oxide film 3. This polycrystalline silicon layer 4 is isolated from other elements by the silicon oxide film 3 and a buried silicon oxide film 5, a monocrystalline silicon layer 6 which becomes a so-called SOI layer is formed on a top layer of this polycrystalline silicon layer 4, structuring an isolation region with the entirety of this region.

Formed in this monocrystalline silicon layer 6 are n$^+$ layers 7 and 8 and p$^+$ layers 9 and 10, bottom portions 11a and 11b of these are connected via the monocrystalline silicon layer 6, thereby respectively structuring pn diodes. That is to say, as shown in FIG. 1, the n$^+$ layer 7 and p$^+$ layer 9 are isolated by the buried silicon oxide film 5 and connected via the polycrystalline silicon layer 4 formed beneath respective lower portions, and the first diode 100 is formed. The second diode 200 is similarly formed by the p$^+$layer 10 and n$^+$ layer 8.

Consequently, as shown in FIG. 4, pn diodes 100 and 200 are formed, one each, as electrostatic discharge protection elements on a power supply VDD side and ground (GND) VSS side, and these are electrically isolated by the silicon oxide films 3 and 5. Incidentally, FIG. 1 omits the connection line between diode 200 and VDD as well as the connection line between diode 100 and VSS.

Through the foregoing structure, a pn junction is formed as an SOI layer in vertical cross-section of the substrate of the proximity of the interface of the monocrystalline silicon layer 6 and polycrystalline silicon layer 4, and so a substantially equivalent pn junction area of the same pattern as the pn diodes formed on the bulk silicon can be assured, and large current can be allowed to flow.

Furthermore, as shown in FIGS. 1 and 4, the first and second diodes 100 and 200 are connected by an aluminum lead 12, and the aluminum lead 12 is connected to an input pad via a protective resistor 13 formed of polycrystalline silicon. The aluminum lead 12 contacts the first diode 100 at a contact region 7' of the n$^+$ layer 7, and contacts the second diode 200 at a contact region 10' of the p$^+$ layer 10.

Additionally, FIG. 3 indicates a sectional structure of an n-channel MOSFET 400 and p-channel MOSFET 500; a thin monocrystalline silicon layer (SOI layer) 6 is formed on a silicon oxide film 5 identical with that indicated in FIG. 2, source and drain layers are formed thereat and a gate electrode 14 is formed thereabove, and the n-channel MOSFET 400 and p-channel MOSFET 500 are formed respectively. This structure is identical with that of the prior art.

Consequently, according to the above-described structure, a normal MOSFET employing a SOI layer 6 composed of monocrystalline silicon in the second region B is formed on a thin-film SOI substrate by semiconductor substrate lamination, and along with this a polycrystalline silicon layer 4 is buried under the SOI 6 composed of monocrystalline silicon at the pn diode of the first region A, and by connecting the n$^+$ layers 7 and 8 and p$^+$ layers 9 and 10 in the SOI layer 6 with the polycrystalline silicon layer 4, pn diodes in which pn junctions are formed in vertical cross-section are respectively structured. Consequently, a large-area pn junction can be assured even in a thin-film substrate.

A specific example of a method of fabrication of a semiconductor device according to the foregoing first embodiment will be described in brief hereinafter with reference to FIG. 5A through FIG. 5H.

Figure 5A:
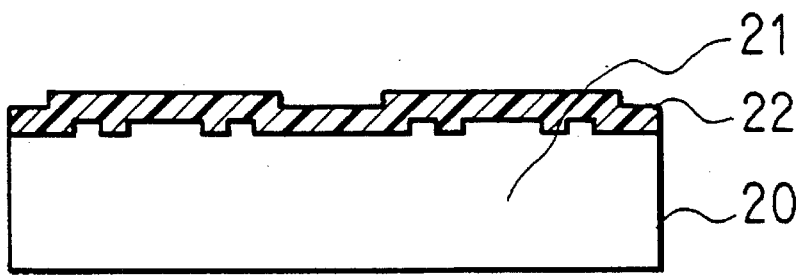
FIG. 5A through FIG. 5H are sectional views showing a method for fabricating a semiconductor device according to the first embodiment.

Firstly, as shown in FIG. 5A, a predetermined SOI region 21 whereat elements are to be formed subsequently is selectively etched on a surface of a first semiconductor substrate (for example a monocrystalline semiconductor substrate) 20 so as to become convex, forming a step having unevenness of approximately 150 nm in height, and thereafter a silicon oxide film 22 with a film thickness of approximately 400 nm is formed on the surface of the substrate 20 thereof by for example a reduced-pressure CVD process. Additionally, it is also acceptable to utilize thermal oxidation in the formation of this oxide film. Moreover, this film is a layer oxide film and may be any material if it functions as a polishing stopper with respect to the silicon during polishing in a later process.

Figure 5B:
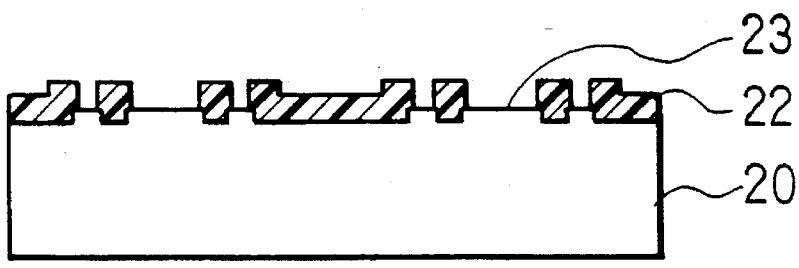

Next, as shown in FIG. 5B, the silicon oxide film 22 is selectively etched so as to open a predetermined region connected to polycrystalline silicon which will be described later.

Figure 5C:
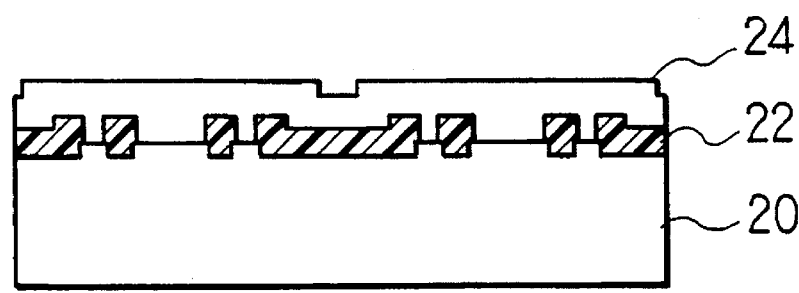

Next, as shown in FIG. 5C, a polycrystalline silicon layer 24 of approximately 500 nm is deposited on the entire surface by for example a low-pressured CVD process. Furthermore, if the present step utilizes an epitaxial-growth device, a monocrystalline silicon layer is deposited in the proximity of the above-mentioned openings. Additionally, polycrystalline deposited by a low-pressured CVD process can be caused to undergo solid-phase growth and monocrystallize by heat treatment at for example 800° C.

Figure 5D:
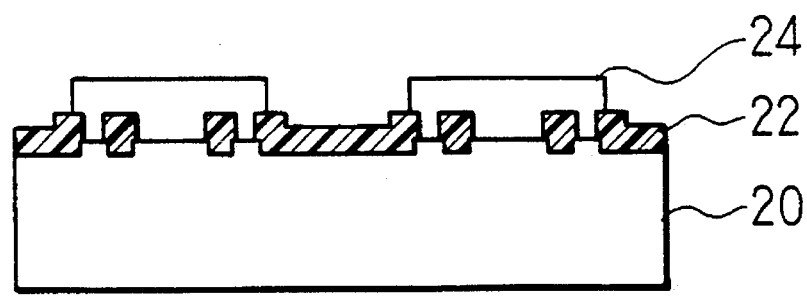

Next, as shown in FIG. 5D, the polycrystalline silicon layer 24 is etched and separated in a predetermined region. Furthermore, in a case where the polycrystalline silicon layer 24 is doped with impurities, it is also acceptable to pattern the region which will become the p layer and perform ion implantation of for example boron or the like, as well as pattern the region which will become the n layer and perform ion implantation of for example phosphorus or the like, before or after etching.

Figure 5E:
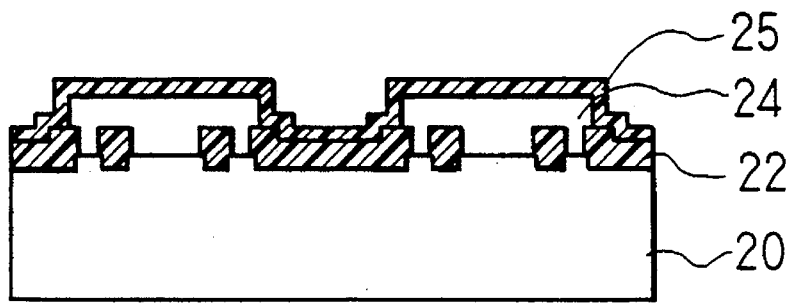

Next, as shown in FIG. 5E, a silicon oxide film 25 of approximately 200 nm is deposited on the entire surface by a CVD process.

Figure 5F:
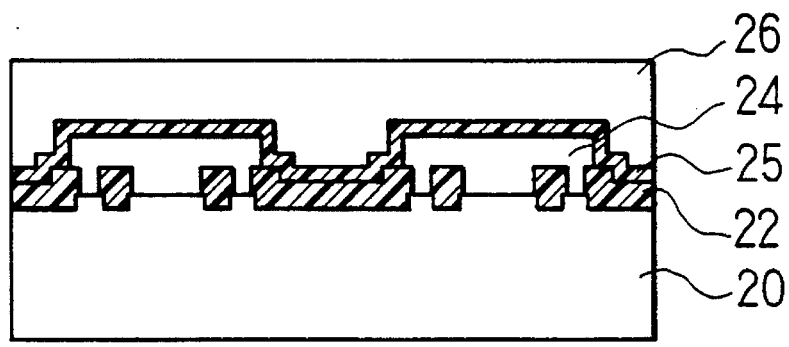

Next, as shown in FIG. 5F, thick-film polycrystalline silicon 26 is deposited to approximately 5 μm on the substrate, and moreover the surface of this thick-film silicon 26 is polished flat. Additionally, because this polycrystalline silicon layer 26 is merely a leveling layer to enable lamination of the substrate to be described later to the surface of the stepped substrate 20, it is not exclusively polycrystalline silicon but may be another material such as silicon oxide film.

Figure 5G:
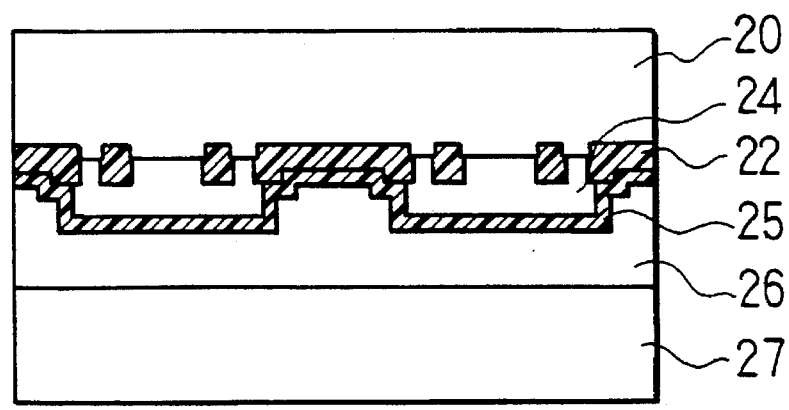

Thereafter, as shown in FIG. 5G, a mirror surface of a second semiconductor substrate (for example a silicon substrate) 27 and the polished surface of the polycrystalline silicon layer 26 are caused to make contact, and the two substrates are directly bonded and integrated by heat treatment for one hour in an inert-gas atmosphere of for example nitrogen or the like, or in an oxidizing atmosphere of oxygen or the like at 1,100° C.

Figure 5H:
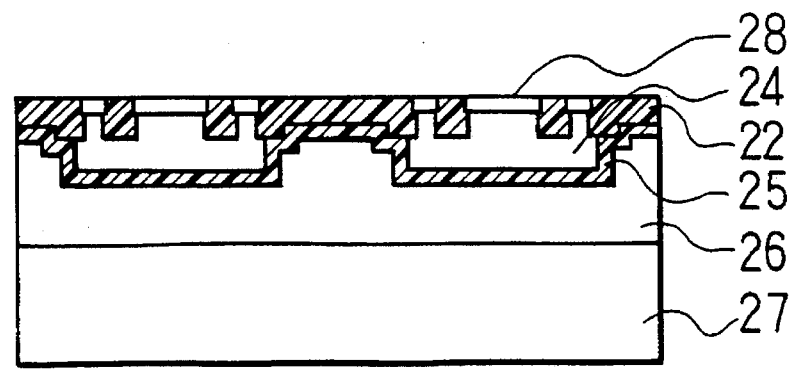

Next, polishing is performed from the rear-surface side (the upper-surface side in FIG. 5G) of the first semiconductor substrate 20, and as shown in FIG. 5H polishing is performed until the silicon oxide film 22 formed in the concavity of the above-described step is exposed to the surface, forming a thin-film monocrystalline silicon layer 28 on the convexity of the foregoing step.

Finally, if a predetermined region of this monocrystalline silicon layer 28 is doped with for example boron or arsenic to form a p$^+$ layer or an n$^+$ layer, the desired pn diode can be formed.

Moreover, the etching of the silicon oxide film 22 indicated in FIG. 5B is performed only with respect to the regions where the first and second diodes 100 and 200 are formed, the silicon oxide film 22 is allowed to remain without change in the other regions where the MOSFETs 400 and 500 and so on are formed, and the MOSFETs indicated in FIG. 3 are formed in the SOI region formed to be surrounded by this silicon oxide film 22.

Figure 6:
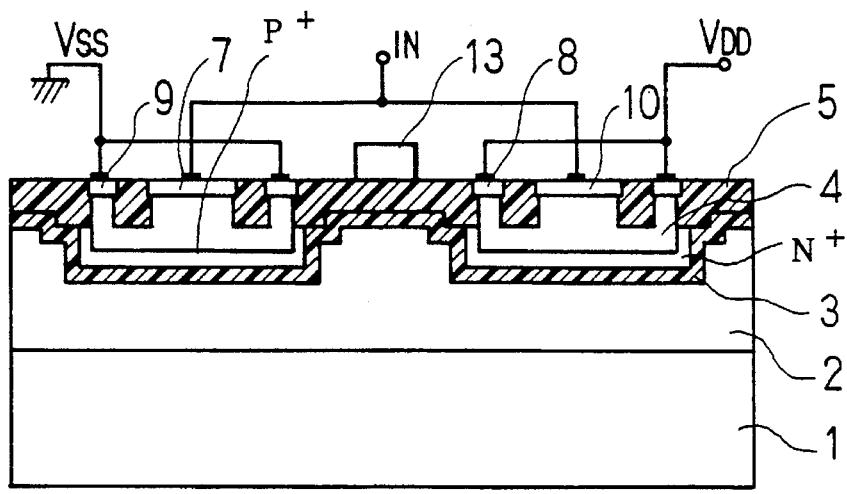
FIG. 6 is a sectional view indicating a structure of another semiconductor device according to the present invention.

Furthermore, in the structure indicated in FIG. 2, because the polycrystalline silicon layer 4 functions as a semiconductor layer for conduction use to cause the n$^+$ layer 7 and p$^+$ layer 9 and the n$^+$ layer 8 and the p$^+$ layer 10 to be electrically conducted, a monocrystalline silicon layer is also acceptable if such functioning is obtained; for example it is acceptable to be doped with boron to become a p$^-$ layer, to be doped with phosphorus to become an n$^-$ layer, or to be undoped to become an intrinsic layer. Additionally, as shown in FIG. 6, it is also acceptable to dope impurities only in the proximity of the silicon oxide film 3 interface of the polycrystalline silicon layer 4 to form respectively a p$^+$ layer and an n$^+$ layer as shown in the drawing. In this case, the resistance of the portion doped with impurities becomes smaller, the flow of discharge current to the diodes becomes smoother, and resistance to destruction can be improved.

Figure 7:
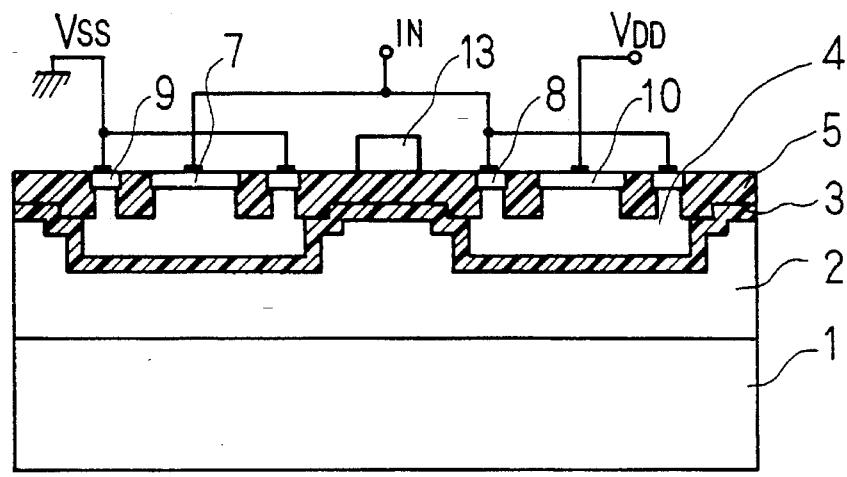
FIG. 7 is a sectional view indicating a structure of another semiconductor device according to the present invention.

Moreover, FIG. 2 indicates a case where a region made p type and a region made n type at the diode on the VDD side and the diode on the VSS side are inverted in a manner similar to a case of electrostatic discharge protection elements on bulk silicon, but because the two diodes are dielectrics and are isolated, a combination of diodes of identical pattern as shown in FIG. 7 is also acceptable.

Figure 8:
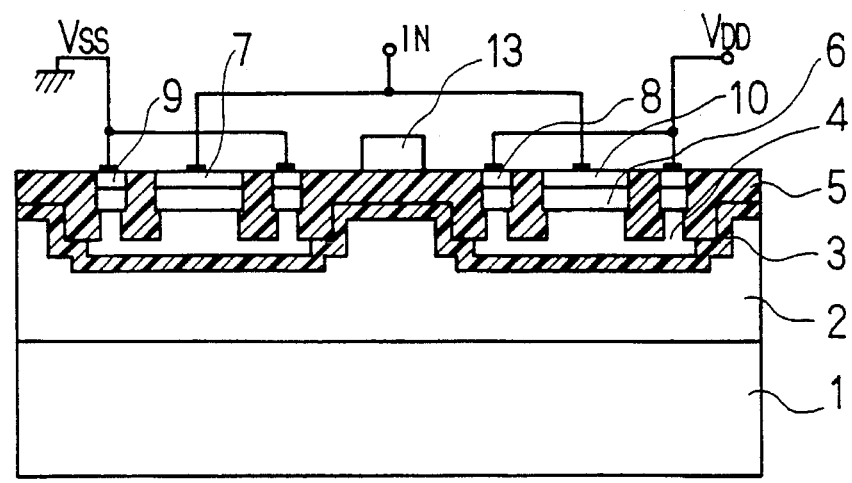
FIG. 8 is a sectional view indicating a structure of another semiconductor device according to the present invention.

Additionally, according to the foregoing first embodiment the film thickness of the thin-film monocrystalline silicon layer 6 is a thin 100 nm or less, and a case where the monocrystalline silicon layer 6 is made entirely an n$^+$ layer or a p$^+$ layer is indicated, but as shown in FIG. 8 it is also acceptable to make the monocrystalline silicon layer 6 a thick 300 nm or so and produce the location of the pn junction in the middle of the monocrystalline silicon layer 6. In this case, the pn junction is formed reliably in the monocrystalline silicon layer 6, and so there is no concern of occurrence of leak current passing through the polycrystalline grain boundary as in a case where the pn junction is formed in the polycrystalline silicon layer 6.

According to the foregoing various embodiments, resistance to electrostatic destruction equivalent to a semiconductor device formed on a bulk silicon substrate can be assured in a semiconductor device having a MOSFET employing a thin-film SOI structure. Additionally, the electrostatic discharge protection elements are structured with a respective pn diode on a power-supply side and a ground side, but in the case of the present embodiment the two diodes are completely isolated by dielectrics, and so the element isolation gap between the foregoing two diodes can be made smaller than in a bulk case, and even if the areas of the pn diodes is the same, the areas as electrostatic discharge protection elements can be made smaller as a result, and there is the effect of no sacrifice in the degree of integration.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device having an SOI structure, comprising:

a semiconductor substrate;

a MOSFET formed on said semiconductor substrate; and an element region disposed on said semiconductor substrate with a region-isolation dielectric layer interposed therebetween and electrically isolated from said semiconductor substrate and said MOSFET, said element region comprising:

a semiconductor film forming an electrical conductive path disposed in said element region;

a first semiconductor layer of a first conductivity type disposed on said semiconductor film forming said electrical conductive path in such a manner that a first connection interface is defined between said first semiconductor layer and said semiconductor film forming said electrical conductive path; and a second semiconductor layer of a second conductivity type disposed on said semiconductor film forming said electrical conductive path in such a manner that a second connection interface is defined between said second semiconductor layer and said semiconductor film forming said electrical conductive path, said first semiconductor layer, said second semiconductor layer and said semiconductor film collectively structuring a diode which forms therein a current path between said first and second semiconductor layers through said first connection interface, said semiconductor film and said second connection interface and which function as an electrostatic discharge protection device of said MOSFET; and a lateral-isolation dielectric layer disposed between said first semiconductor layer and said second semiconductor layer to electrically isolate, in lateral direction, said first semiconductor layer from said second semiconductor layer, wherein said lateral-isolation dielectric layer has a bottom located at a depth deeper than said first and second connection interfaces.

2. A semiconductor device according to claim 1, wherein said first semiconductor layer and said second semiconductor layer are disposed on said semiconductor film with monocrystalline semiconductor layers respectively interposed therebetween.

3. A semiconductor device according to claim 1, wherein said semiconductor film is one selected from the group consisting of said first conductivity type, said second conductivity type and an intrinsic type.

4. A semiconductor device according to claim 1, wherein said first and second semiconductor layers have a same thickness.

5. A semiconductor device according to claim 1, wherein said MOSFET is formed in another element region disposed on said semiconductor substrate with said region-isolation dielectric layer interposed therebetween.

6. A semiconductor device according to claim 5, wherein said first and second semiconductor layers and said another element region formed therein said MOSFET have a same thickness.

7. A semiconductor device according to claim 5, wherein top surfaces of said first and second semiconductor layers and said another element region are co-planar.

8. A semiconductor device according to claim 5, wherein said element region in which is formed said diode is walled off at a bottom and sides thereof by said region-isolation dielectric layer.

9. A semiconductor device according to claim 8, wherein said another element region in which is formed said MOSFET is walled off at a bottom and sides thereof by said region-isolation dielectric layer.

10. A semiconductor device according to any one of claims 5 through 9, wherein said semiconductor film is a polycrystalline semiconductor film.

11. A semiconductor device according to claim 10, wherein said first and second semiconductor layers and said another element region are composed of monocrystalline semiconductor.

12. A semiconductor device having an SOI structure, comprising:

a substrate;

a dielectric film disposed on said substrate;

a p-type semiconductor layer and an n-type semiconductor layer independently disposed from each other over said dielectric film; and a semiconductor film for conduction use between said p-type and n-type semiconductor layers, said semiconductor film underlying said p-type semiconductor layer and said n-type semiconductor layer and being disposed between said p-type and n-type semiconductor layers and said dielectric film such that said p-type semiconductor layer, said semiconductor film and said n-type semiconductor layer collectively form a PN diode of an SOI structure.

13. A semiconductor device according to claim 12, further comprising a semiconductor island disposed on said dielectric film and in which a MOSFET is formed as another SOI structure, wherein said PN diode is electrically connected to said MOSFET to function as an electrostatic discharge protection element.

14. A semiconductor device according to claim 13, wherein said p-type and n-type semiconductor layers and said semiconductor island have a same thickness.

15. A semiconductor device according to claim 14, wherein said p-type and n-type semiconductor layers and said semiconductor island are composed of monocrystalline semiconductor.

16. A semiconductor device according to claim 13, wherein said p-type and n-type semiconductor layers and said semiconductor island are composed of monocrystalline semiconductor.

17. A semiconductor device according to claim 13, wherein top surfaces of said p-type and n-type semiconductor layers and said semiconductor island are co-planar.

18. A semiconductor device according to claim 12, further comprising a lateral-isolation dielectric film disposed between said p-type semiconductor layer and n-type semiconductor layer and having a bottom located deeper than each of bottoms of said p-type and n-type semiconductor layers.

19. A semiconductor device according to claim 12, wherein said semiconductor film is one selected from the group consisting of a p-type film, an n-type film and an intrinsic film.

20. A semiconductor device according to claim 12, wherein said p-type and n-type semiconductor layers are composed of monocrystalline semiconductor.

21. A semiconductor device according to claim 12, wherein top surfaces of said p-type and n-type semiconductor layers are co-planar.

22. A semiconductor device according to any one of claims 12, 13 and 18–15, wherein said semiconductor film is a polycrystalline semiconductor film.

23. A semiconductor device according to claim 22, wherein said PN diode of said SOI structure is walled off at a bottom and sides thereof by said dielectric film.

* * * * *